United States Patent
Marzalek et al.

(10) Patent No.: US 7,088,088 B1
(45) Date of Patent: Aug. 8, 2006

(54) TRIGGERED NARROW-BAND METHOD FOR MAKING PULSED-RF NETWORKING MEASUREMENTS

(75) Inventors: Michael S. Marzalek, Santa Rosa, CA (US); David J. Ballo, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/038,345

(22) Filed: Jan. 19, 2005

(51) Int. Cl.
*G01R 23/00* (2006.01)

(52) U.S. Cl. .................. 324/76.19; 324/76.28
(58) Field of Classification Search ............. 324/76.22, 324/76.19, 76.28
See application file for complete search history.

(56) References Cited

U.S. PATENT DOCUMENTS 5,059,915 A * 10/1991 Grace et al. ................ 324/650
6,631,341 B1 * 10/2003 Kameda et al. ............. 702/124

OTHER PUBLICATIONS

David J. Ballo, Pulsed-RF S-Parameter Measurements Using a VNA, Agilent Technologies, Inc., Component Test Division, 5-12, 17, 18, 20, 21,37, 38, 48, 49, 52-54, 62-67, 69 (Oct. 13, 2004).

* cited by examiner

*Primary Examiner*—Walter Benson

(57) ABSTRACT

A method of measuring a device under test ("DUT") includes applying a pulsed-RF input signal to the DUT and coupling an output of the DUT to a receiver having an output bandwidth selected to measure a center tone in an RF pulse response spectrum from the output of the DUT. The receiver is triggered so as to sample data output from the DUT during a window period, and stops taking data after the window period.

16 Claims, 5 Drawing Sheets

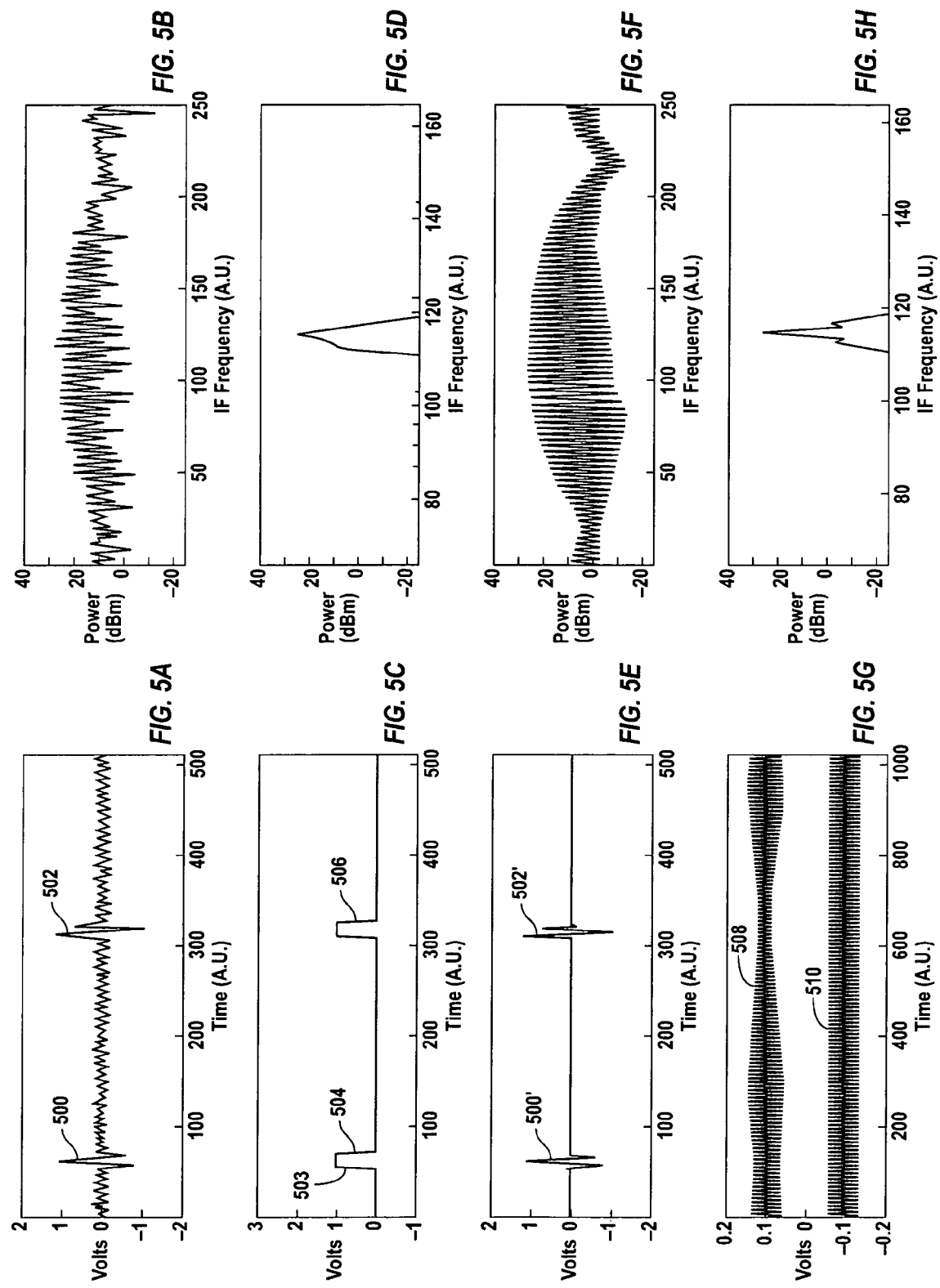

TRIGGERED NARROW-BAND METHOD FOR MAKING PULSED-RF NETWORKING MEASUREMENTS

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Many microwave electronic systems operate in a pulsed-RF mode. Radar systems and time-division multiple access ("TDMA") wireless communications systems are examples of systems that operate in a pulsed-RF mode. Radar systems typically operate with signals in the range of several gigahertz ("GHz") to tens of GHz and use devices such as antennas, amplifiers, transmit-receive modules, and frequency converters ("mixers"). TDMA wireless communication systems typically operate below about 6 GHz, and use similar electronic devices as are used in radar systems. However, most electronic devices are tested under continuous wave ("CW") conditions. That is, the electronic device that is being tested, which is commonly called a "device under test" or "DUT," is stimulated with a CW signal, and the response of the signal is measured with a receiver, such as a signal analyzer or a network analyzer.

Some electronic devices behave differently when stimulated with a pulsed-RF signal, rather than a CW signal. Bias changes during the RF pulse can affect the radio-frequency ("RF") performance of the device. Overshoot, ringing or droop (gain reduction during the latter part of the RF pulse typically due to self heating) that does not occur when the device is tested with a CW signal can result when using a pulsed signal. In other instances, a CW signal might destroy the DUT. For example, performing a CW wafer test (i.e. on DUTs that have not been separated from the wafer on which they were fabricated) might destroy a DUT that is not adequately heat sunk. Other DUTs might not be designed to operate in a CW mode, such as high-power amplifiers used in radar systems. More information on testing DUTs using pulsed-RF measurement techniques is found in Pulsed-RF S-Parameter Measurements Using a VNA by David Ballo, AGILENT TECHNOLOGIES, INC. (Oct. 13, 2004), the disclosure of which is hereby incorporated in its entirety for all purposes.

There are two conventional techniques for pulsed-RF testing of DUTs. The first technique is commonly called the "wide-band" synchronous pulsed measurement technique. A receiver with a relatively wide output bandwidth, specifically an output bandwidth sufficient to allow the receiver to capture all or essentially all of the RF pulse energy, is used. To measure a characteristic of interest of the RF pulse, such as rise time, the RF pulse rise time must be longer than 1/BW. The minimum RF pulse duration measurable using this technique is limited by the maximum bandwidth of the receiver being used.

Wide-band pulsed-RF measurements are synchronous. That is, the receiver is synchronized with the incoming RF pulses and knows when to capture (i.e. measure) the RF pulse energy. This requires a trigger signal, which for periodic RF pulses can be internally generated by the receiver, such as a MODEL 8510™ network analyzer manufactured by AGILENT TECHNOLOGIES, INC., of Palo Alto, Calif., or the trigger signal is provided to the receiver from an external source, such as a pulse generator. Wide-band pulsed-RF measurements are desirable because the dynamic range is independent of duty cycle; however, the dynamic range is limited by the wide IF bandwidth.

There is a lower limit of measurable RF pulse widths. As the RF pulse width becomes shorter, the spectral energy of the RF pulse in the frequency domain spreads out. RF pulses of short duration may have spectral content that falls outside the IF bandwidth. If a significant amount of energy is outside of the bandwidth of the receiver, the receiver cannot accurately represent and measure the RF pulse response of the DUT.

The second pulsed-RF technique is commonly called the narrow-band asynchronous pulsed-RF measurement technique ("narrow-band RF pulse detection"). Narrow-band RF pulse detection is used when enough of the RF pulse spectrum is outside the bandwidth of the receiver so that wideband detection cannot be used. With this technique, everything except the central frequency component ("center tone") of the pulsed-RF spectrum is filtered out by the receiver. A relatively narrow (compared to the spectrum of the RF pulse) IF filter is used, and an arbitrarily narrow RF pulse may be measured. The narrow IF filter measures the center tone of the RF pulse spectrum (which represents the frequency of the RF carrier). After filtering, narrow-band RF pulse detection is similar to a CW measurement, which receivers handle very well.

With narrow-band RF pulse detection, the sample periods of the analyzer are not synchronized with the incoming RF pulses; therefore, no pulse trigger is required. This is why this technique is often called asynchronous acquisition mode. An advantage of using narrow-band RF pulse detection is that there is no lower RF pulse-width limit, since no matter how broad the RF pulse spectrum is, most of it is filtered away, leaving only the center tone of the DUT's RF pulse response spectrum.

Unfortunately, the dynamic range of the measurement is a function of duty cycle. As the RF pulse duty cycle drops, the energy in the central tone drops while the noise power stays constant. Thus, as the duty cycle of the RF pulses decreases (i.e. longer time between RF pulses), the average power of the RF pulses gets smaller, which degrades the signal-to-noise ratio. The effect is often called "pulse desensitization." This causes the dynamic range of narrow-band asynchronous RF pulse detection to degrade by 20*log (duty cycle). The narrow-band asynchronous RF pulse measurement technique is sometimes called a high pulse repetition frequency ("PRF")" technique, since the PRF is normally much greater than the IF bandwidth in order to maintain good dynamic range.

Therefore, methods of measuring devices using pulsed-RF that avoid the disadvantages described above are desirable.

BRIEF SUMMARY OF THE INVENTION

A method of measuring a device under test ("DUT") includes applying a pulsed-RF input signal to the DUT and coupling an output of the DUT to a receiver having an output bandwidth selected to measure a center tone in an RF pulse response spectrum from the output of the DUT. The receiver is triggered so as to sample data output from the DUT during a window period, and stops taking data after the window period.

BRIEF DESCRIPTION OF THE DRAWINGS

FIGS. 5A–5H illustrate a triggered narrow-band RF pulse measurement technique according to an embodiment of the present invention.

DETAILED DESCRIPTION OF THE EMBODIMENTS

Figure 1:
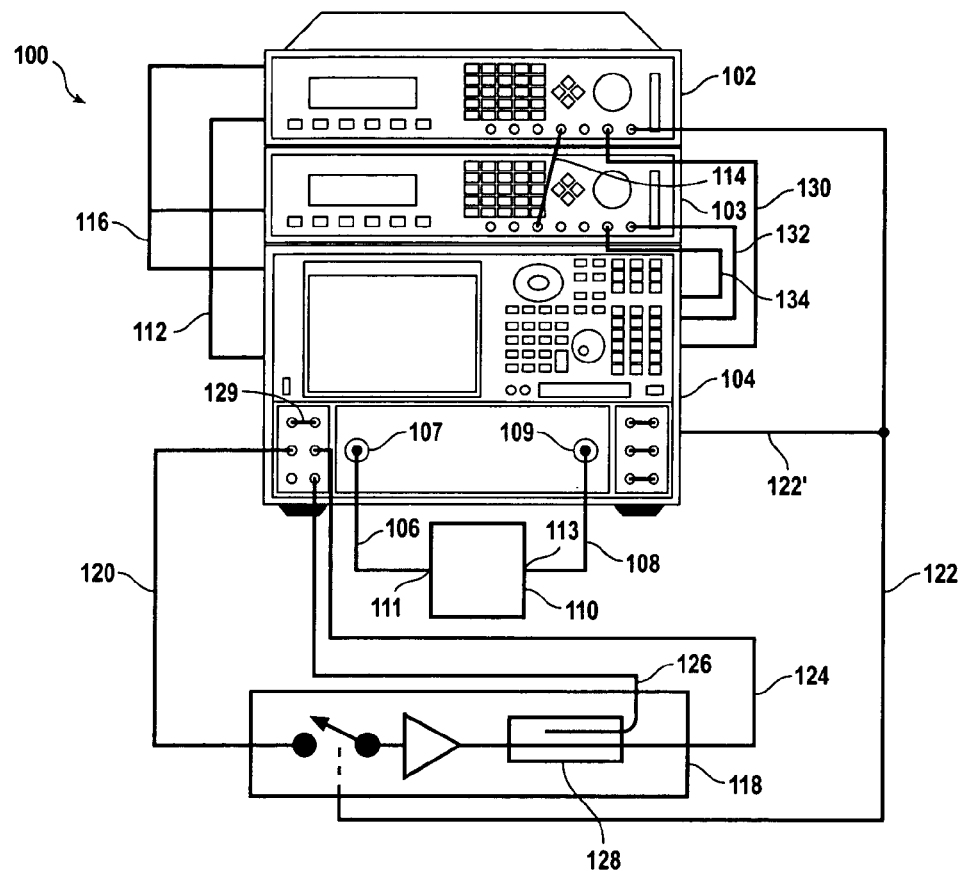
FIG. 1 shows an exemplary test set for measuring electronic devices according to embodiments of the invention.

FIG. 1 shows an exemplary test set 100 for measuring electronic devices according to embodiments of the invention. The test set 100 includes a first pulse generator 102, a second pulse generator 103, and a receiver 104, such as a spectrum analyzer, a network analyzer, or a specialized receiver. In a particular embodiment, the receiver is a MODEL E8362B™ network analyzer, available from AGILENT TECHNOLOGIES, INC., of Palo Alto, Calif., and the pulse generator is a MODEL 81110A™, also available from AGILENT TECHNOLOGIES, INC. A spectrum analyzer is useful as a receiver when amplitude versus frequency measurements are desired. A network analyzer is useful as a receiver when amplitude versus frequency and/or phase versus frequency measurements are desired. A spectrum analyzer can measure signals generated by a DUT, or signals provided to a DUT from a signal source, such as a sweeper or synthesizer, and output from the DUT to the receiver. A network analyzer makes stimulus-response measurements, where a test signal is provided to the DUT. The test signal is provided from a source internal to the network analyzer or alternatively from an external source. Test cables 106, 108 connect a DUT 110 to test ports 107, 109 of the receiver 104. For example, if a transmission or gain measurement of the DUT 110 is desired, a first test port 107 provides a pulse-modulated RF input signal to the input 111 of the DUT, and hence is considered a source output port. The output 113 of the DUT is connected to a second test port 109, which is considered a receiver input port.

The DUT may be characterized in many different ways. For example, a two-port DUT may be characterized by its S-parameters: $S_{11}$, $S_{12}$, $S_{21}$, and $S_{22}$. When measuring $S_{11}$, the first test port 107 provides the pulsed-RF input signal and receives the reflected signal from the input 111 of the DUT. Such notation is commonly used and is familiar to those of skill in the art of high-frequency test and measurement techniques. Other DUTs have one port, or alternatively more than two ports.

The first pulse generator 102 and the receiver 104 operate off of a common time base, such as a 10 MHz reference signal 112. The first pulse generator 102 provides a trigger signal 114 to the second pulse generator 103. An optional general-purpose interface bus ("GPIB") 116 allows coordinated operation of the test instruments by a controller that resides in one of the test instruments, or is an external controller (not shown).

A high-frequency modulator 118, such as a MODEL Z5623A™ option H81, available from AGILENT TECHNOLOGIES, INC., of Palo Alto, Calif., switches the source output 120 from the network analyzer 104 on and off according to a pulse output signal 122 from the first pulse generator 102. This provides a pulsed source output ("pulsed-RF signal") 124 and a pulsed-RF reference output 126 (from a directional coupler 128). The modulator 118 can modulate signals from about 1 GHz to about 20 GHz. A "pulsed-RF signal" or "pulsed carrier signal" means that an RF signal is on for a selected period of time, and then off for a selected period of time, in other words, that an RF signal is convolved with a pulse train. A coaxial jumper cable 129 provides user access to the "A" port of the test receiver, which is not needed in this instance. Similar coaxial jumpers on the other side of the receiver are not used in forward-pulsed-RF measurements, but are used in other embodiments to access signal paths of the receiver. A trigger signal 122' from the first pulse generator 102 is coupled to the receiver. The trigger signal 122' is used in conjunction with an internal delay circuit (not shown) of the receiver 104 to enable the receiver 104 to measure ("sample") data at the test ports 107, 109 when RF pulse information is present. The physical connector for the trigger signal 122' is on the back panel (not shown) of the receiver 104.

Pulse generators often provide multiple outputs that have individually variable delay. Alternative test sets use a splitter and external delay lines, such as tunable delay lines or fixed delay lines, such as a long length of cable, in combination with a pulse output. Similarly, other alternative test sets provide more or fewer pulse outputs, and an individual pulse generator may have more or fewer pulse outputs than the exemplary pulse generators shown in FIG. 1.

Output channels 130, 132, 134 from the pulse generators drive receiver gates (not shown) inside the receiver, such as what are commonly referred to as the A gate, the B gate, the $R_1$ gate and the $R_2$ gate in a MODEL E8362B™ network analyzer, available from AGILENT TECHNOLOGIES, INC., of Palo Alto, Calif., synchronizing data acquisition at these gates with the RF pulse output from the DUT for point-in-pulse and pulse-profile measurements. More information on point-in-pulse and pulse-profile measurements is found in Pulsed-RF S-Parameter Measurements Using a VNA by David Ballo, AGILENT TECHNOLOGIES, INC. (Oct. 13, 2004), particularly on pages 10–13.

The pulsed-RF signal will be demodulated in the receiver. This detection is accomplished using analog circuitry and/or digital-signal processing ("DSP") techniques. During a wide-band pulsed-RF measurement, the analyzer is synchronized with the pulsed-RF signal ("RF pulse stream"), and data acquisition occurs when the RF pulse response of the DUT is present at the receiver. This means that a pulse trigger that is synchronized to the PRF is present. Some receivers, such as the MODEL 8510™ network analyzer have a built-in pulse generator to synchronize the data acquisition. Alternative receivers use an external pulse generator for this purpose.

The test set 100 is used to make a triggered narrow-band pulsed-RF measurement of the DUT 110 that improves the dynamic range achieved by about 10*log(duty cycle) compared to a similar asynchronous narrow-band pulsed-RF measurement. The receiver is triggered to start taking signal data before the RF pulse, and to stop taking signal data after the RF pulse, rather than measuring noise. Examples of how a receiver stops taking signal data according to embodiments include grounding the analog input signal, feeding digital null data from a register to a DSP, programming a DSP to process null data after the RF pulse, or disabling data collection (e.g. stopping data processing). Some embodiments use a combination of techniques.

In some embodiments it is desirable to avoid a sharp transition between the measured signal data and the null condition by "tapering" the transition. Generally, tapering the transition involves a gradual transition between signal data such as the RF pulse signal data or noise signal data, and the null condition over a few samples. Otherwise, a sharp transition might occur, which can generate spectral components that degrade the measurement by increasing the noise power. In an analog signal path, tapering is achieved with a shunt capacitor or a low-pass filter before the analog-to-digital converter ("ADC"). Tapering is achieved in a digital case by using a multiplier in series with the digital signal output that transitions a coefficient between "1" and "0" at a window boundary. Alternatively, a DSP is programmed to apply a coefficient that transitions between "1" and "0" at a window boundary. Such techniques are familiar to those skilled in the art of finite impulse response techniques, and other techniques for zeroing or nulling the data may be or become apparent.

Embodiments of the invention will be explained in reference to measurements obtained using conventional narrow-band and wide-band techniques. The test set 100 is calibrated using standard calibration techniques under pulsed-RF conditions. Mechanical standards and/or an electronic calibration module ("ECal") can be used. Generally, a separate calibration is performed for each set of pulse, triggering, and windowing conditions.

Figure 4:
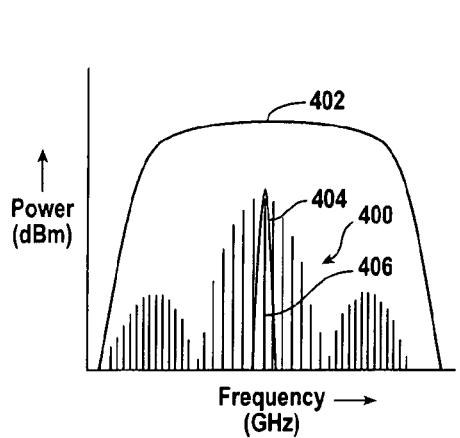
FIG. 4 shows an RF pulse spectrum in the frequency domain.
Figure 2B:
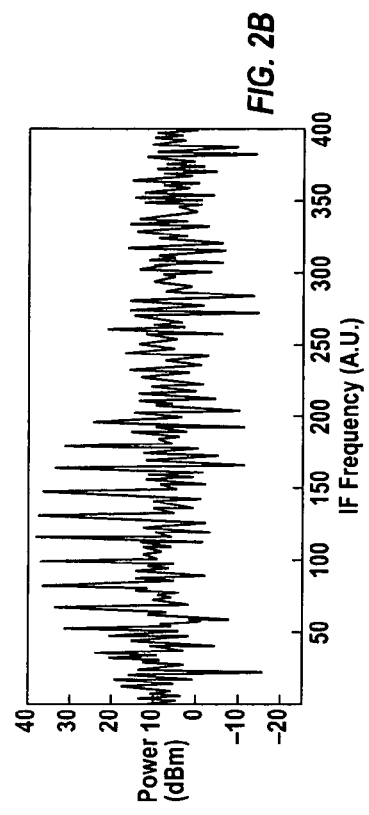
FIGS. 2A–2F illustrate a wide-band RF pulse detection technique.
Figure 2D:
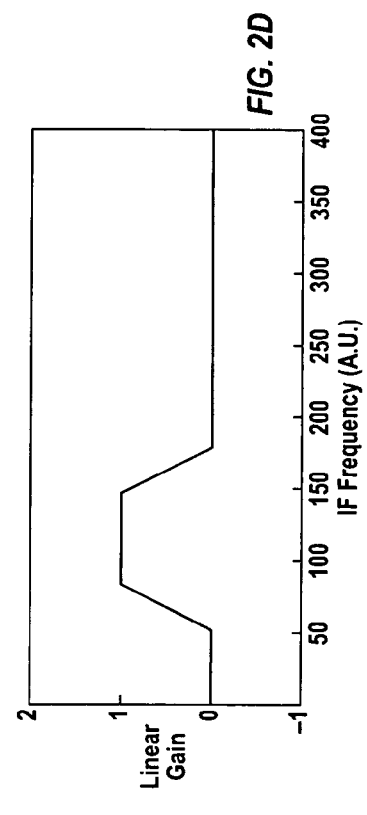
Figure 2F:
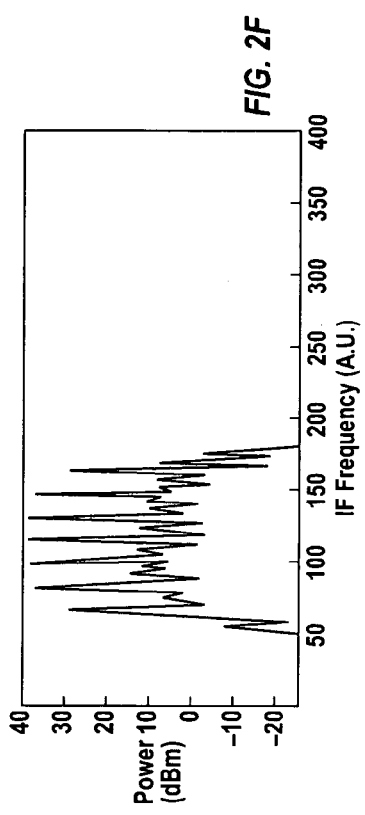
Figure 2A:
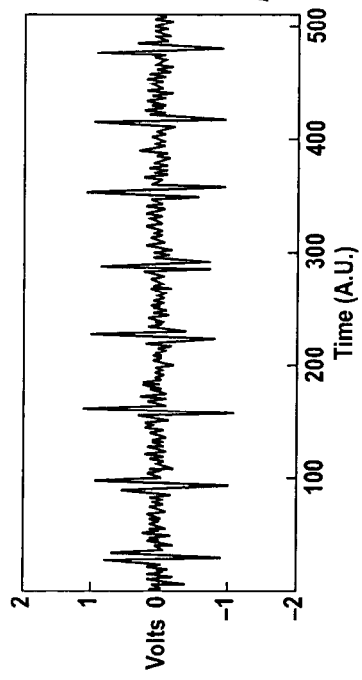

FIGS. 2A–2F illustrate a wide-band pulsed-RF detection technique (see also, FIG. 4, ref. num. 402). FIGS. 2A–2F, 3A–3F, and 5A–5H were generated using MATLAB®, available from THE MATHWORKS, Natick, Mass. FIG. 2A shows a plot of a pulsed-RF input signal in the time domain and FIG. 2B shows a plot of the corresponding spectrum of the pulsed-RF input signal in the frequency domain. The y-axis of FIG. 2A is volts; however, the units were arbitrarily chosen for modeling purposes. The x-axis of FIG. 2A represents time as a number of samples taken for a given sampling rate expressed in arbitrary units ("A.U."). The A.U. values are provided only for purposes of comparison. Note that the time scale in FIG. 2E has been expanded to show more detailed information. The number of samples were arbitrarily chosen for modeling purposes. The y-axis of FIG. 2B is power in dBm, and the x-axis represents the IF frequency, going from zero Hertz to about one-half the sampling rate. The units are arbitrary and provided only for purposes of comparison.

Figure 2C:
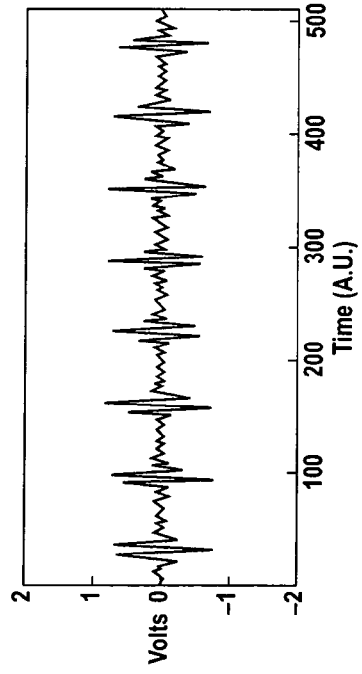
Figure 2E:
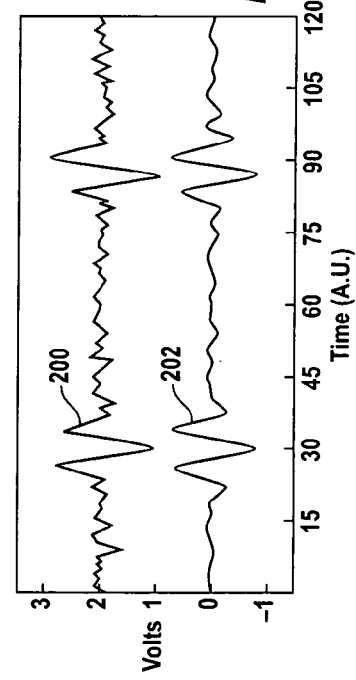

The RF pulse spectrum shown in FIG. 2B mostly fits within the output bandwidth of the receiver being used. FIG. 2C shows a plot of the IF time response shaped by the IF frequency response, and FIG. 2D shows a plot of the IF frequency response (linear gain versus IF frequency). FIG. 2E shows a first plot 200 of a portion of the input RF pulse train (see FIG. 2A) and a second plot 202 of a portion of the IF time response shaped by the IF frequency response (see FIG. 2C) on an expanded time scale. A voltage offset of two volts has been added to the first plot for purposes of illustration. Essentially, FIG. 2E provides a close-up comparison of the input RF pulses to the IF time response. FIG. 2F shows a plot of the RF pulse spectrum (refer to FIG. 2B) modified by the IF frequency response (refer to FIG. 2D). Thus, the plot of the RF pulse spectrum shown in FIG. 2F is essentially the transformation of the plot shown in FIG. 2C into the frequency domain.

The limited bandwidth shows up in the plot shown in FIG. 2F having attenuated spectral components, compared to FIG. 2B, at points away from the center of the RF pulse's spectrum. Comparing FIG. 2C to FIG. 2A, there is less noise but more ringing after the input RF pulse stream is shaped by the IF filter, due to the limited IF frequency response. In other words, the RF pulse's response is colored by the IF frequency response. Accuracy of the wide-band RF pulse measurement can be improved using calibration techniques.

The entire RF pulse spectrum is captured in one measurement event, and is often referred to as a "single-shot" measurement. This approach provides RF pulse information with little distortion. Referring to FIG. 2E, note that the RF pulse constructed in the time domain from IF data is faithful to the original RF pulse, which is an advantage of a wide-band RF pulse detection technique.

FIGS. 3A–3F illustrate a narrow-band RF pulse detection technique (see also, FIG. 4, ref. nums. 404, 406). The IF filter response is narrowed so that it contains only one spectral tone. This results in much less information needing to be stored and also reduces digitizing rate constraints. Typically, successive RF pulses are measured, which when filtered produces an essentially CW signal.

Figure 3A:
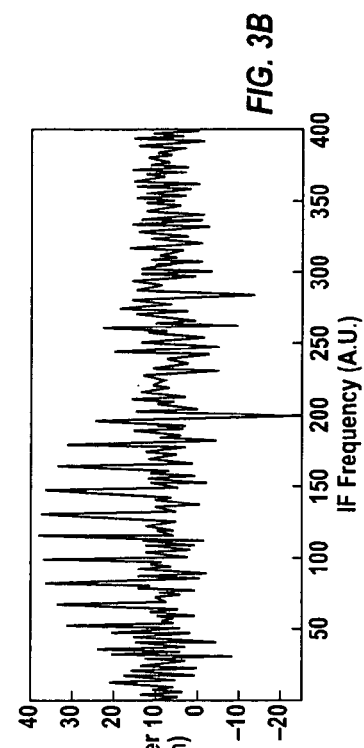
FIGS. 3A–3F illustrate a narrow-band RF pulse detection technique.
Figure 3B:
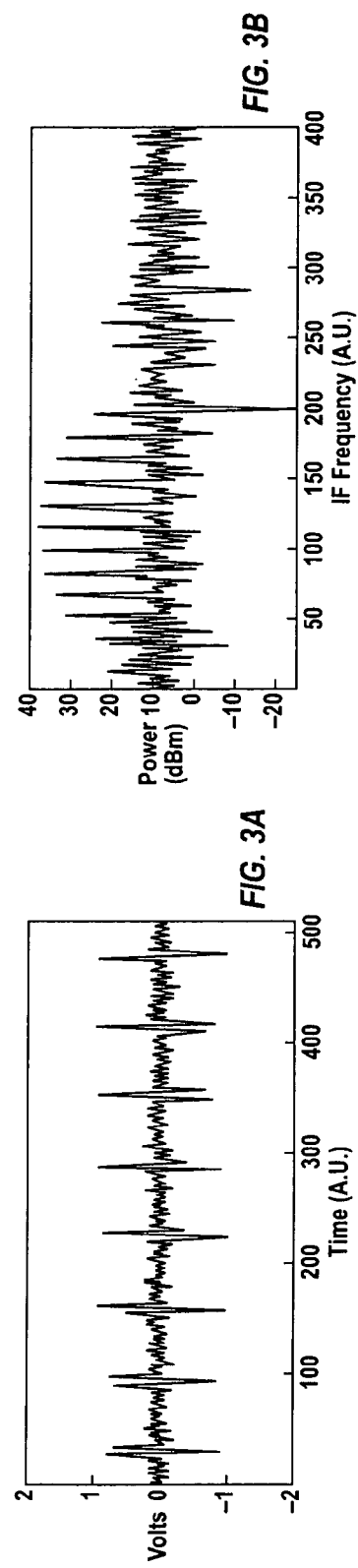
Figure 3C:
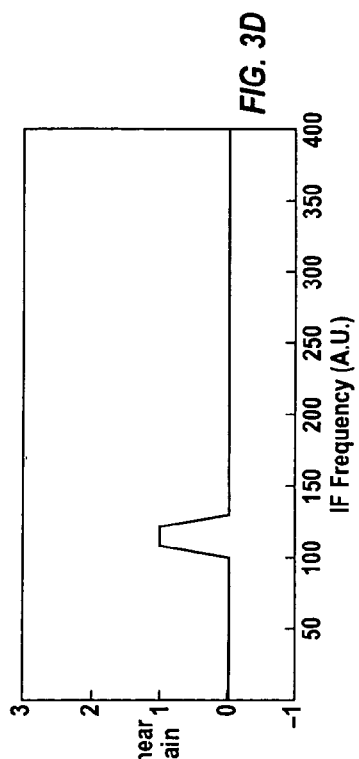
Figure 3D:
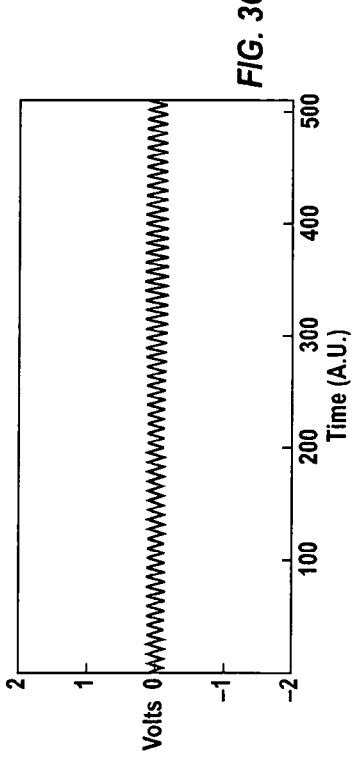
Figure 3E:
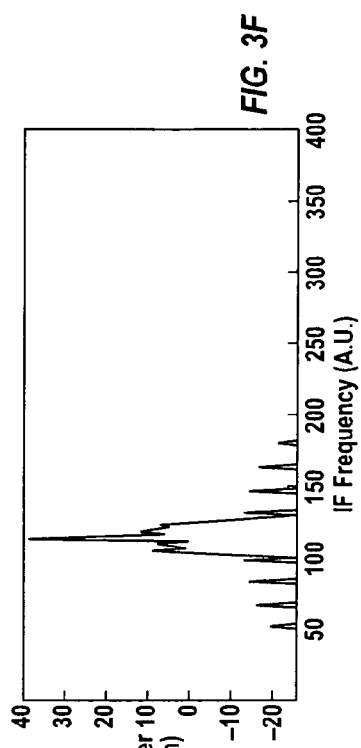
Figure 3F:
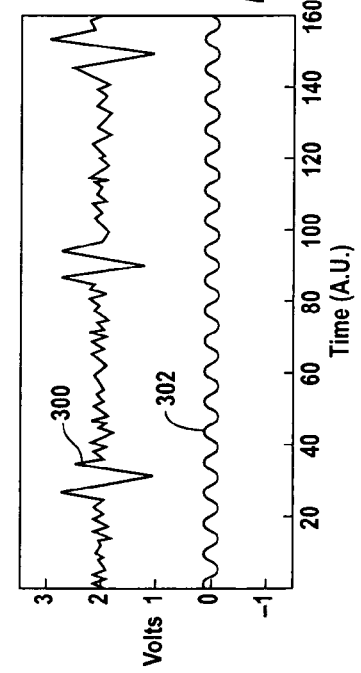

FIG. 3A shows a plot of a pulsed-RF input signal in the time domain, and FIG. 3B shows a plot of the corresponding spectrum of the pulsed-RF input signal in the frequency domain. FIG. 3C shows a plot of the IF time response shaped by the IF frequency response, and FIG. 3D shows a plot of the IF frequency response. FIG. 3E shows a first plot 300 of a portion of the pulsed-RF input signal constructed in the time domain from input data (see FIG. 3A), and a second plot 302 of a portion of the IF time response shaped by the IF frequency response (see FIG. 3C) on an expanded time scale. A voltage offset of two volts has been added to the first plot for purposes of illustration. Essentially, FIG. 3E provides a close-up comparison of the input RF pulses to the IF time response. FIG. 3F shows a plot of the RF pulse spectrum (refer to FIG. 3B) modified by the IF frequency response (refer to FIG. 3D). Thus, the plot of the RF pulse spectrum shown in FIG. 3F is essentially the transformation of the plot shown in FIG. 3C into the frequency domain.

Using the IF bandwidth to select only one spectral tone makes the IF of the RF pulse look like a CW or pure tone measurement, which is a common mode of operation for several types of receivers. It is worth noting that even with the relatively high duty cycle shown in FIG. 3A (in which the RF pulse is present about 20% of the time) that the amplitude of the CW tone shown in FIGS. 3C and 3E is significantly lower than the original RF pulse amplitude. The amplitude will drop even further as the duty cycle is reduced, while the noise power will stay constant. Thus, the dynamic range of the RF pulse measurement will degrade as the duty cycle is reduced.

FIG. 4 shows an RF pulse spectrum 400 in the frequency domain. A first IF filter response 402 is sufficiently wide to include most of the RF pulse spectrum 400. A receiver having an IF filter with such a filter response is used in wide-band pulsed-RF techniques to capture the entire RF pulse in a single event. A second IF filter response 404 is narrow compared to the first IF filter response, and passes essentially only the central tone 406 of the RF pulse spectrum 400.

FIGS. 5A–5H illustrate a triggered narrow-band pulsed-RF measurement technique according to an embodiment of the present invention. The receiver is triggered to start taking signal data just before the RF pulse arrives at the receiver test port and continues to take signal data until the RF pulse has sufficiently decayed, and then stops taking signal data. It is desirable to trigger the receiver before the RF pulse arrives so that any trigger jitter occurs in the noise portion of the signal, rather than during the RF pulse. Trigger jitter during the RF pulse could result in an inaccurate measurement. The receiver samples signal data during the RF pulse, and may sample RF pulse data more than once during a single RF pulse if the RF pulse is wide enough, depending on the sampling rate, which is typically determined by the receiver. It may be desirable to capture multiple pulses, which can be done by triggering the receiver multiple times, depending on the IF bandwidth.

In one embodiment, a receiver is triggered by a leading edge of a trigger signal and acquires data at a sampling rate for a user-selected period of time that is entered into the receiver. For example, in a test set having a pulse generator driving an RF modulator, the length of the RF pulse (i.e. RF pulse duration) is known and the receiver is programmed to acquire RF pulse data until the RF pulse has sufficiently decayed (e.g. approximately the RF pulse duration). The receiver might sample an RF pulse only once, or might sample an RF pulse several times, depending on the RF pulse duration and sampling rate. After the RF pulse has decayed, the receiver stops taking signal data, which is accomplished by forcing zero data or disabling data measurement, for example. Forcing zeroed data and disabling data measurement are further discussed below in view of FIGS. 6, 7A, 7B, and 7C. Switching between signal data and zeroed may occur may occur multiple times during the period of data acquisition. By not taking data during the periods of noise between pulses, the dynamic range of the triggered narrow-band pulsed-RF measurement is improved, compared to a conventional, asynchronous narrow-band pulsed-RF measurement.

Another reason for having the receiver enabled before the RF pulse arrives in a triggered narrow-band RF pulse detection is that the analog-to-digital converter ("ADC") of the IF signal can have several micro-seconds of trigger jitter, and it is desirable to enable the receiver sufficiently soon so that portions of the RF pulse signal are not lost. The ADC acquisition versus the modulated RF pulse will jitter by at least one sample period of the ADC clock.

The receiver (see FIG. 1, ref. num. 104) has an indication of when an RF pulse will be present at the input to sample data. The indication can come from an external trigger, such as from a trigger output of a pulse generator (see FIG. 1, ref. num. 114) that is advanced or retarded relative to the pulse provided to the RF modulator 118. Alternatively, the receiver detects when an RF pulse is present and samples RF pulse data until the receiver detects that the RF pulse has decayed.

The narrow IF filter excludes all but a central tone of the RF pulse spectrum so that the receiver selectively measures the central tone. This is important because the IF filter does not have to be flat in magnitude and phase across many spectral tones. Measuring a single tone of the RF pulse spectrum requires less digitizing and memory resources compared to a wide-band RF pulse detection technique. The RF pulse(s) that are captured are used to construct an essentially CW tone (see FIG. 5G, ref. num. 510).

The external or internal trigger of the receiver is set so that the receiver essentially only takes (samples) data from the input signal during an RF pulse window (a few samples before and/or after the RF pulse may measure noise), and does not take data after the RF pulse window, when the RF pulse is not present. In some embodiments, a constant PRF is used to test the DUT (FIG. 1, ref. num. 110). Triggered narrow-band RF pulse measurement techniques include point-in-pulse measurements and pulse-profile measurements by gating the IF signal. Gating the IF signal provides the receiver with a portion of the RF pulse.

FIG. 5A shows a plot of a series of RF pulses 500, 502 in a pulsed-RF input signal. The duty cycle has been reduced to a few percent to more clearly illustrate this measurement technique. FIG. 5B shows a plot of the spectrum of FIG. 5A in the frequency domain. FIG. 5C shows a plot of a trigger signal provided to a receiver or generated by a receiver in a test set (see FIG. 1). The rising edge 503 of the trigger signal establishes when the receiver should start measuring the input signal in order to measure the RF pulse. A clock drives an analog-to-digital converter ("ADC") within the receiver. The ADC digitizes the voltage at the input (see FIG. 1, ref. num. 109). The ADC clock rate determines how often the input is sampled (see FIG. 6 and associated discussion, below). When the receiver is triggered, the RF pulse is sampled.

Referring to FIG. 5A, the signal between the RF pulses 500, 502 is noise. By windowing the signal, most of the unwanted noise data between the sampled RF pulse data is eliminated. Knowing which signal data to take and which to not take is done in a number of ways. In one embodiment, the input to the ADC is shunted to ground, i.e. zero volts. In an alternative embodiment, a multiplier between the ADC and DSP multiplies the digital output of the ADC by a coefficient of "1" during the RF pulse window, and transitions from and to a coefficient of "0" before and after the RF pulse window, thus zeroing-out the subsequent noise data. This eliminates the noise between RF pulses from being measured by the receiver, improving the dynamic range of the measurement.

In a particular embodiment, the RF pulse width of the pulse signal modulating the RF signal is known (see FIG. 1, ref. nums. 122, 118). In an alternative embodiment, a number of incoming RF pulses are characterized by the receiver, and their width is determined by the receiver before beginning the triggered narrow-band pulsed-RF measurement. In yet another embodiment, the receiver has sufficient signal processing capability to determine when the RF pulse data has sufficiently decayed to distinguish between RF pulse and noise data samples.

FIG. 5D shows a plot of a sub-region of FIG. 5B after being modified by the IF frequency response of the receiver. FIG. 5E shows a plot representing the time-gated input signal in the time domain. Note that there is essentially no noise energy between the input RF pulses 500', 502'. FIG. 5F shows a plot of the spectral response of the windowed input RF pulses in the frequency domain. FIG. 5H shows a plot of a sub-region of FIG. 5F after being modified by the IF frequency response. FIG. 5G shows a first plot 508 in the time domain that is the inverse transform of the spectrum of the input RF pulse shown in FIG. 5D, and a second plot 510 in the time domain that is the inverse transform of the spectrum of the gated input RF pulse shown in FIG. 5H.

Comparing FIG. 5B to FIG. 5F and FIG. 5D to FIG. 5H, note how much the triggered narrow-band pulsed-RF detection technique has suppressed the noise. The noise suppression is also evident by comparing the first and second plots 508, 510 in FIG. 5G, where the spectrums of FIGS. 5D and 5H have been inverse-transformed back into the time domain. The amplitude of the first plot 508 is much less stable than the lower plot 510, which was derived using triggered narrow-band pulsed-RF detection.

Figure 6:
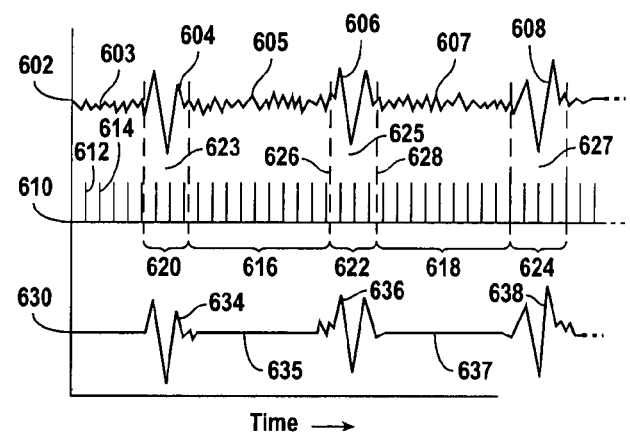
FIG. 6 shows a series of plots illustrating data sample windowing.

FIG. 6 shows a series of plots illustrating data windowing. A first plot 602 shows RF pulses 604, 606, 608 in the time domain (compare with FIG. 3E). Noise power 603, 605, 607 is present between the RF pulses 604, 606, 608. This noise power undesirably affects the dynamic range of the measurement. A second plot 610 shows a series of periodic sampling events 612, 614 that represent when the receiver is taking data. The period of the sampling events is determined by the ADC clock.

Some samples, such as the samples within brackets 616, 618, capture only noise. Other samples, such as the samples within brackets 620, 622, 624, capture RF pulse data. The samples capturing RF pulse data occur within a time window 625 ("window" or "pulse window") having a leading edge 626 of the window 625 occurring at the receiver trigger and a trailing edge 628 of the window 625 selected by the user according to the known RF pulse width (RF pulse duration). The trigger signal synchronizes the window to the pulsed-RF input signal (see FIG. 3A). Alternatively, the receiver detects when the RF pulse has decayed and sets the trailing edge of the window after the RF pulse has been sampled. In practice, there may be a few noise samples taken before the beginning of an RF pulse, and a few noise samples might be taken after the RF pulse.

Three sampling events of RF pulse 606 occur between the leading edge 626 and the trailing edge 628 of the window 625. Different numbers of sampling events may occur for different RF pulses in the pulsed-RF input signal. Similarly, different numbers of sampling events occur for pulsed-RF input signals having longer or shorter RF pulse durations. The number of sampling events per RF pulse is also affected by the ADC clock rate. A faster ADC clock rate will provide more signal data samples from the RF pulse (and also from the noise), while a slower ADC clock rate will provide fewer signal data samples from the RF pulse. The selected IF bandwidth determines the total number of samples and the number of pulses utilized.

A third plot 630 shows RF pulses 634, 636, 638 in the time domain according to an embodiment of the invention. The samples of RF pulse data occurring within the windows 623, 625, 627 are retained. However, the noise portions 605, 607 of the pulsed-RF input signal are zeroed out resulting in zeroed portions 635, 637. This provides a significant improvement in dynamic range compared to a conventional narrow-band RF pulse detection technique. The noise portions 605, 607 are zeroed out using any of several techniques, such as measuring zeroed analog data, measuring zeroed digital data, multiplying noise signal data by a zero coefficient, or by stopping data collection after the window period. Each of these techniques, and combinations of these techniques, results in stopping the measurement of signal data after the window period, essentially replacing what would otherwise be noise data with null values. For purpose of discussion, "taking data" means measuring signal power, whether it is an RF pulse signal or a noise signal, since sampling of noise might occur during a window period in some embodiments. "Stopping data taking" means that the measured data is zeroed out, multiplied by a coefficient other than "1" (i.e. a zero coefficient or a transition coefficient), or data collection is disabled.

When duty cycle is reduced using a triggered narrow-band RF pulse detection technique, both the noise amplitude and the spectral tone amplitude drop. The noise is reduced due to windowing the sampled data in the time domain, which eliminates noise when an RF pulse is not present at the receiver input by zeroing the data. The central tone of the RF pulse drops at 20*log(duty cycle), while the noise drops at about lo*log(duty cycle). Thus, the dynamic range drops by about 10*log(duty cycle). The improvement using triggered narrow-band pulsed-RF detection compared to using conventional narrow-band pulsed-RF detection is the ratio of the time the sampled data is in its forcing-zero-amplitude state to when the sampled data contains input signal data, which is usually almost exclusively RF pulse data, yet may contain a few samples of noise data, depending on triggering accuracy, windowing accuracy, and jitter, for example.

For example, a 30 dB improvement in dynamic range is achieved for a 0.1% duty cycle when using triggered narrow-band pulsed-RF detection (assuming essentially no noise contribution from the data sampled during the window period) compared to similar conventional narrow-band pulsed-RF detection. For every factor of 10 decrease in duty cycle, the dynamic range of a triggered narrow-band pulsed-RF measurement is reduced by 10 dB (compared to a 20 dB reduction for an un-triggered narrow-band technique).

Figure 7A:
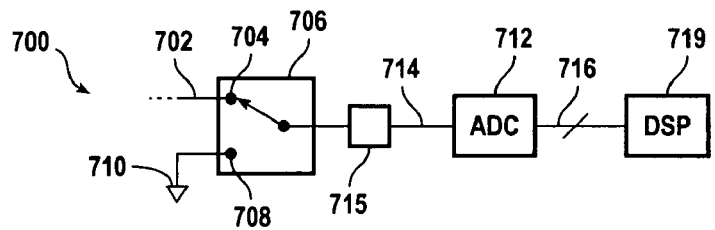
FIG. 7A shows a portion of a block diagram of a receiver according to an embodiment of the invention.

FIG. 7A shows a portion 700 of a block diagram of a receiver according to an embodiment of the invention. An analog input signal 702 is coupled to a first port 704 of a switch 706. A second port 708 of the switch 706 is coupled to ground 710. The analog input signal 702 is the result of a signal path through the receiver that typically includes a series of frequency filters and mixers (not shown) that down-convert the RF input signal to a final IF that is coupled to a detector (not separately shown) in an ADC 712.

The ADC 712 converts an analog ADC input signal 714 to a digital ADC output signal 716, which is provided to a DSP 719. The switch 706 is switched to the analog input signal 702 during the window periods (see FIG. 6, ref. nums. 623, 625, 627) and is switched to ground 710 between window periods. Switching the ADC 712 to ground 710 zeros out the ADC input signal 714 between window periods, which improves the dynamic range of the measurement of the pulsed-RF input signal. Reconstructing the RF input signal from the digitized IF data would result in a plot substantially in accordance with plot 630 of FIG. 6. A tapering element 715, such as a capacitor or low-pass filter, is optionally placed between the switch 706 and the ADC 712 to avoid high-frequency spectral components that might arise when the switch 706 is switched between the analog input signal 702 and ground 710.

Figure 7B:
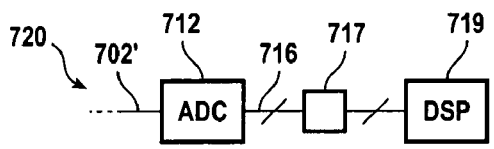
FIG. 7B shows a portion of a block diagram of a receiver according to another embodiment of the invention.

FIG. 7B shows a portion 720 of a block diagram of a receiver according to another embodiment of the invention. An analog input signal 702' is coupled to an ADC 712. The digital output 716 of the ADC 712 is coupled to a multiplier 717 that multiplies the digital output 716 by a coefficient of "1" during the window, and transitions to a coefficient of "0" outside the window, which forces the digital data to zero. In a particular embodiment, the multiplier transitions between a coefficient of "1" and a coefficient of "0" over a few sample periods to taper the digital data from measured data to zeroed data. In an alternative embodiment, the multiplier 717 is omitted and the DSP 719 is programmed to provide a coefficient that transitions between "1" during the window and "0" outside the window. Reconstructing the pulsed-RF input signal from the digitized data would result in a plot substantially in accordance with plot 630 of FIG. 6.

Figure 7C:
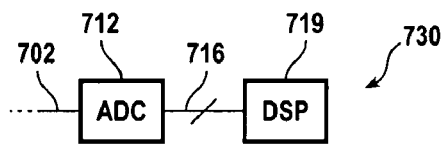
FIG. 7C shows a portion of a block diagram of a receiver according to yet another embodiment of the invention.

FIG. 7C shows a portion 730 of a block diagram of a receiver according to yet another embodiment of the invention. The analog input signal 702 is provided to the ADC 712. The ADC 712 converts the analog input signal 702 to a digital ADC output signal 716, which is provided to a DSP 719. The DSP is programmed to process null pseudo-data outside of the window period. In a particular embodiment, the transition between processing the digital ADC output signal and processing null pseudo-data is tapered. In an alternative embodiment, the DSP is programmed to stop processing data outside of the window period. There are other ways to program a DSP to disable data taking. Reconstructing the RF input signal from either the zeroed data or from data collected during the window and disabled between windows would result in a plot substantially in accordance with plot 630 of FIG. 6.

Figure 8:
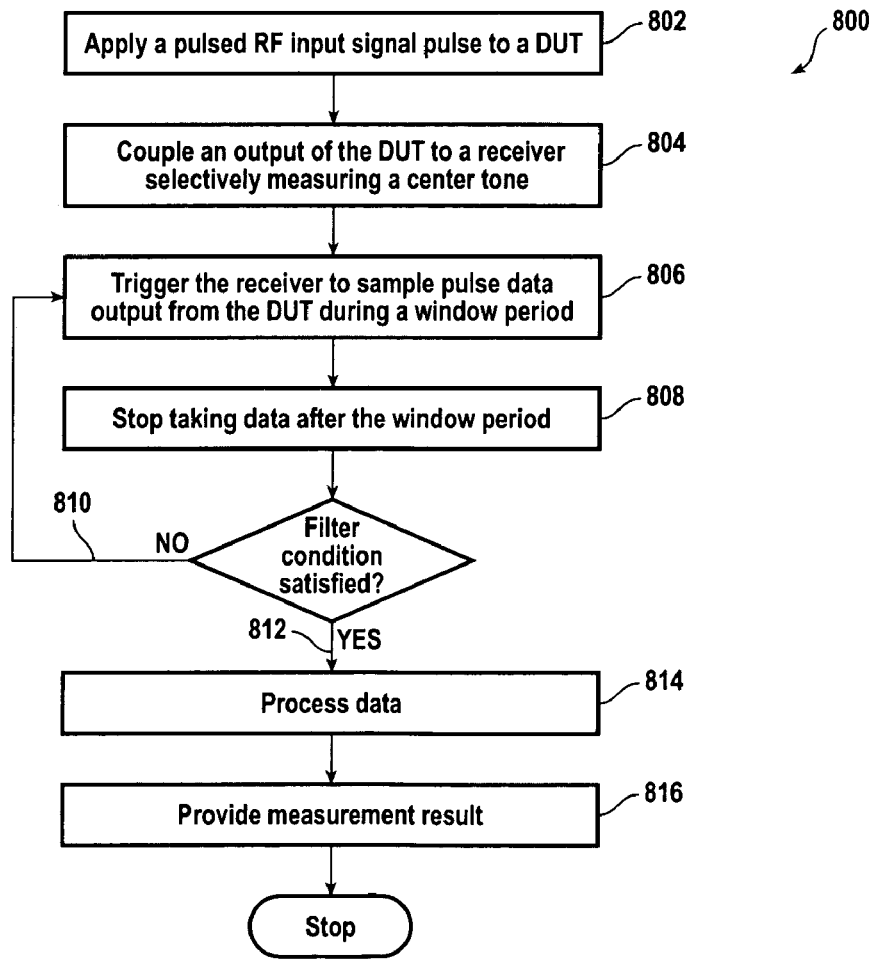
FIG. 8 is a flow chart of a method of measuring a DUT according to an embodiment of the invention.

FIG. 8 is a flow chart of a method 800 of measuring a DUT according to an embodiment of the invention. A pulsed-RF input signal is applied to the DUT (step 802). An output of the DUT is coupled to a receiver set to a narrow bandwidth (i.e. a bandwidth chosen to selectively measure essentially only the center tone in an RF pulse response spectrum from the DUT output) (step 804). The receiver is triggered so as to sample RF pulse data output from the DUT during a window period (step 806), and so as to stop taking data after the window period (step 808). If the sampled data is not sufficient to satisfy a filter condition of the receiver, such as if an analog filter is sufficiently charged or a digital filter is sufficiently filled to yield a complex filtered output point, another RF pulse is measured (branch 810). If the filter condition is satisfied (branch 812), the receiver processes the data (step 814), which has typically been stored in computer-readable memory, to provide a measurement result (step 816).

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A method of measuring a device under test ("DUT") comprising:
   1) applying a pulsed-RF input signal to the DUT;
   2) coupling an output of the DUT to a receiver selectively measuring a center tone in an RF pulse response spectrum from the output of the DUT;
   3) triggering the receiver so as to sample data output from the DUT during a window period;
   4) stopping data taking after the window period;
   5) determining if a filter condition has been satisfied; and, if the filter condition has not been satisfied;
   6) repeating triggering the receiver so as to sample data output from the DUT during a window period and stopping data after the window period.

2. The method of claim 1 wherein the step of stopping data taking is performed from a trailing edge of a first window period to a leading edge of a second window period.

3. The method of claim 1 wherein stopping data taking after the window period comprises at least one of measuring zeroed analog data, measuring zeroed digital data, multiplying digital data by a zero coefficient, and stopping data collection.

4. The method of claim 1 wherein stopping data taking after the window period occurs during a noise portion of the pulsed-RF input signal.

5. The method of claim 1 wherein triggering the receiver so as to sample data output from the DUT during a window period occurs during a noise portion of the pulsed-RF input signal.

6. The method of claim 1 wherein stopping data taking after the window period includes tapering.

7. The method of claim 6 wherein tapering includes multiplying a digital output by a coefficient transitioning between a value of "1" and a value of "0" over a plurality of samples.

8. The method of claim 6 wherein tapering includes filtering an analog-to-digital converter input signal.

9. The method of claim 6 wherein tapering includes multiplying a digital input to a digital signal processor by a coefficient transitioning between a value of "1" and a value of "0" over a plurality of samples.

10. The method of claim 9 further comprising disabling data collection when the coefficient has decreased to "0."

11. The method of claim 6 wherein the tapering occurs within a digital signal processor.

12. The method of claim 1 wherein stopping data taking after the window period includes programming a digital signal processor to process null pseudo-data after the window period.

13. The method of claim 1 wherein triggering the receiver so as to sample data output from the DUT during a window period comprises providing an external trigger signal to the receiver.

14. The method of claim 1 wherein triggering the receiver so as to sample data output from the DUT during a window period comprises generating an internal trigger signal in the receiver.

15. The method of claim 1 wherein the window period is established according to a pre-determined RF pulse duration.

16. The method of claim 1 wherein the window period is established according to a measured RF pulse duration.

* * * * *